(12) United States Patent
Mehrl et al.

(10) Patent No.: US 10,629,576 B2
(45) Date of Patent: Apr. 21, 2020

(54) OPTICAL PROXIMITY SENSOR ARRANGEMENT AND METHOD FOR PRODUCING AN OPTICAL PROXIMITY SENSOR ARRANGEMENT

(71) Applicant: ams AG, Unterpremstaetten (AT)

(72) Inventors: David Mehrl, Plano, TX (US); Greg Stoltz, Flower Mound, TX (US)

(73) Assignee: ams AG, Unterpremstaetten (AT)

( * ) Notice: Subject to any disclaimer, the term of this patent is extended or adjusted under 35 U.S.C. 154(b) by 62 days.

(21) Appl. No.: 15/442,536

(22) Filed: Feb. 24, 2017

(65) Prior Publication Data

US 2017/0250169 A1 Aug. 31, 2017

Related U.S. Application Data

(60) Provisional application No. 62/300,203, filed on Feb. 26, 2016.

(30) Foreign Application Priority Data

Mar. 17, 2016 (EP) .................................. 16160935

(51) Int. Cl.
*H01L 27/15* (2006.01)
*H01L 25/16* (2006.01)
(Continued)

(52) U.S. Cl.
CPC .......... *H01L 25/167* (2013.01); *G01S 7/4811* (2013.01); *G01S 7/4813* (2013.01);
(Continued)

(58) Field of Classification Search
CPC ................. H01L 25/167; H01L 31/167; H01L 31/02162; H01L 31/02327; H01L 25/165; G01S 7/4811; G01S 17/02
(Continued)

(56) References Cited

U.S. PATENT DOCUMENTS 4,857,746 A * 8/1989 Kuhlmann ............... G01V 8/12
438/24
5,726,443 A * 3/1998 Immega ................ G01S 17/026
250/208.1
(Continued)

*Primary Examiner* — Mohammad M Hoque
(74) *Attorney, Agent, or Firm* — Fish & Richardson P.C.

(57) ABSTRACT

An optical proximity sensor arrangement comprises a semiconductor substrate (100) with a main surface (101). A first integrated circuit (200) comprises at least one light sensitive component (201). The first integrated circuit is arranged on the substrate at or near the main surface. A second integrated circuit (300) comprises at least one light emitting component (301), and is arranged on the substrate at or near the main surface. A light barrier (400) is arranged between the first and second integrated circuits. The light barrier being designed to block light to be emitted by the at least one light emitting component from directly reaching the at least one light sensitive component. A multilayer mask (500) is arranged on or near the first integrated circuit and comprising a stack (501) of a first layer (502) of first elongated light blocking slats (503) and at least one second layer (504) of second elongated light blocking slats (505). The light blocking slats are arranged in the mask to block light, incident on the mask from a first region of incidence (701), and to pass light, incident on the mask from a second region of incidence (702), from reaching the at least one light sensitive component.

18 Claims, 9 Drawing Sheets

(51) Int. Cl.
  *G01S 7/481* (2006.01)
  *G01S 17/04* (2020.01)
  *G01S 17/02* (2020.01)
  *H01L 31/0216* (2014.01)
  *H01L 31/0232* (2014.01)
  *H01L 31/167* (2006.01)

(52) U.S. Cl.
  CPC .............. *G01S 17/02* (2013.01); *G01S 17/04* (2020.01); *H01L 25/165* (2013.01); *H01L 31/02162* (2013.01); *H01L 31/02327* (2013.01); *H01L 31/167* (2013.01)

(58) Field of Classification Search
  USPC .......................................................... 257/82
  See application file for complete search history.

(56) References Cited

U.S. PATENT DOCUMENTS

| | | | | |
|---|---|---|---|---|
| 6,693,292 | B1 * | 2/2004 | Lewis | B41J 2/2135 |
| | | | | 250/559.29 |
| 6,875,974 | B2 | 4/2005 | Muesch et al. | |
| 9,189,074 | B2 * | 11/2015 | Kuo | G06F 3/017 |
| 9,449,427 | B1 * | 9/2016 | Baldwin | G06T 15/50 |
| 9,820,355 | B2 * | 11/2017 | Jia | H05B 37/0218 |
| 10,015,582 | B2 * | 7/2018 | Wagner | A61B 5/6898 |
| 2003/0168580 | A1 * | 9/2003 | Romhild | G01S 7/4811 |
| | | | | 250/216 |
| 2003/0173506 | A1 * | 9/2003 | Paritsky | H04R 23/008 |
| | | | | 250/227.14 |
| 2005/0253212 | A1 * | 11/2005 | Nam | H01L 27/14623 |
| | | | | 257/432 |
| 2007/0086565 | A1 | 4/2007 | Thompson et al. | |
| 2007/0205285 | A1 * | 9/2007 | Tan | G06K 7/10831 |
| | | | | 235/454 |
| 2007/0241943 | A1 * | 10/2007 | Tan | G01D 5/34715 |
| | | | | 341/50 |
| 2007/0290284 | A1 * | 12/2007 | Shaffer | H01L 27/1446 |
| | | | | 257/432 |
| 2010/0283998 | A1 * | 11/2010 | Souchkov | G01J 1/02 |
| | | | | 356/141.2 |
| 2010/0295143 | A1 | 11/2010 | Yokogawa | |
| 2011/0042766 | A1 * | 2/2011 | Kurokawa | G02F 1/133514 |
| | | | | 257/432 |
| 2011/0198632 | A1 * | 8/2011 | Lerman | H01L 25/0753 |
| | | | | 257/91 |
| 2011/0248151 | A1 * | 10/2011 | Holcombe | G01S 3/7803 |
| | | | | 250/221 |
| 2012/0026161 | A1 * | 2/2012 | Chen | G02B 5/06 |
| | | | | 345/419 |
| 2012/0290255 | A1 * | 11/2012 | Kelkar | H01L 25/167 |
| | | | | 702/150 |
| 2012/0312962 | A1 * | 12/2012 | Hebert | G06F 3/04883 |
| | | | | 250/206.1 |
| 2013/0120760 | A1 * | 5/2013 | Raguin | G01B 11/24 |
| | | | | 356/612 |
| 2013/0302724 | A1 * | 11/2013 | Yang | G03F 1/36 |
| | | | | 430/5 |
| 2014/0084308 | A1 * | 3/2014 | Wong | H01L 25/167 |
| | | | | 257/84 |
| 2015/0179830 | A1 * | 6/2015 | Sugiura | G01J 1/0271 |
| | | | | 257/432 |
| 2015/0206914 | A1 * | 7/2015 | Rudmann | B29D 11/00307 |
| | | | | 257/98 |
| 2015/0371074 | A1 * | 12/2015 | Lin | H01L 27/14679 |
| | | | | 382/124 |
| 2016/0252225 | A1 * | 9/2016 | Tsujimoto | E06B 9/24 |
| | | | | 359/598 |
| 2016/0299008 | A1 * | 10/2016 | Manninger | G01J 3/513 |
| 2016/0307881 | A1 * | 10/2016 | Ho | H01L 25/167 |
| 2018/0057956 | A1 * | 3/2018 | Kobayashi | C21D 8/12 |

* cited by examiner

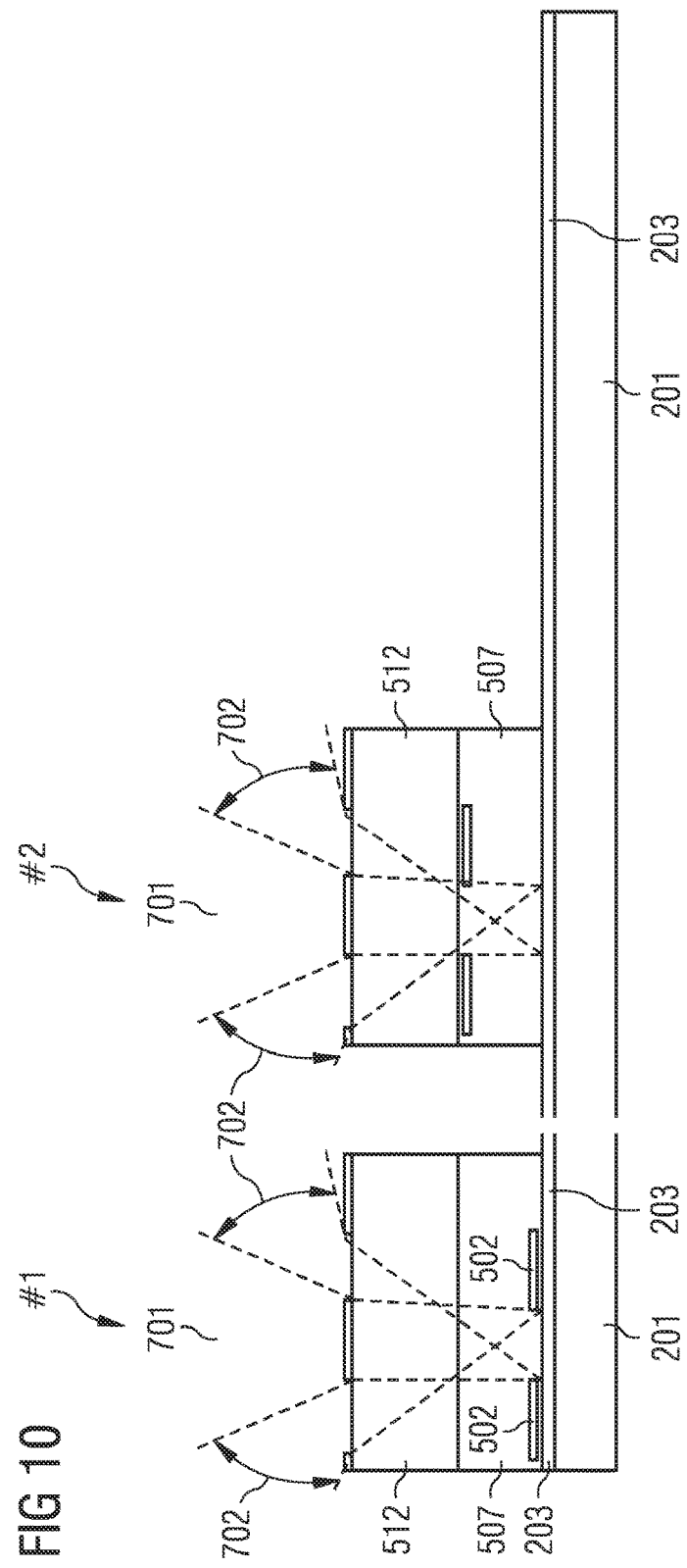

OPTICAL PROXIMITY SENSOR ARRANGEMENT AND METHOD FOR PRODUCING AN OPTICAL PROXIMITY SENSOR ARRANGEMENT

CROSS-REFERENCE TO RELATED APPLICATION

This application claims priority to European Patent Application No. 16160935.9, filed Mar. 17, 2016, and to U.S. Provisional Patent Application No. 62/300,203, filed Feb. 26, 2016, all of which are hereby incorporated by reference in their entirety for all purposes.

The following relates to an optical proximity sensor arrangement and to a method for producing an optical proximity sensor arrangement.

BACKGROUND OF THE INVENTION

Optical proximity sensors are active sensors that are used to detect the presence or distance of an object within their measuring range. Typically an optical proximity sensor comprises a light source to emit light towards an object, and an optical sensor that detects the amount of light which eventually gets reflected back from the object. The light source generates visual, infrared or ultraviolet (UV) light depending on the spectral sensitivity of sensor. Typically, the light source is chosen to emit light that is not likely to be generated by other nearby sources. Infrared emission is used in common optical proximity sensors. The sensor typically is a semiconductor device such as a photodiode, which generates a current when light energy strikes it.

Optical crosstalk has always been the most significant problem for optical proximity sensors, due mainly to Fresnel reflections off of the inside and outside surfaces of glass or plastic covers that typically cover the proximity sensor in cell phone and tablet products, for example. Fresnel reflection or specular reflection denotes mirror-like reflection of light, or of other kinds of electromagnetic waves, from a surface, in which light from a single incoming direction is reflected into a single outgoing direction, determined by the law of reflection. While there are other non-specular ray paths (generally caused by random scatter), the specular reflection is usually the biggest contributor.

Attempts are made to control optical crosstalk by using small air gaps between sensor and cover, rubber boots, specially inked apertures on the phone glass, and specially shaped apertures on the shields. Even with dedicated system design, the crosstalk can still be problematic in a final product due to variations in factors such as air gap, lateral device alignment with respect to apertures and the like.

SUMMARY OF THE INVENTION

It is to be understood that any feature described in relation to any one embodiment may be used alone, or in combination with other features described, and may also be used in combination with one or more features of any other of the embodiments, or any combination of any other of the embodiments unless described as alternative. Furthermore, equivalents and modifications not described below may also be employed without departing from the scope of the optical proximity sensor arrangement and the method for producing an optical proximity sensor arrangement which is defined in the accompanying claims.

In one embodiment an optical proximity sensor arrangement comprises a semiconductor substrate, a first integrated circuit, a second integrated circuit, a light barrier and a multilayer mask.

The semiconductor substrate, or wafer, has a main surface. For example, the substrate comprises a material such as silicon, silicon dioxide, aluminum oxide, sapphire, germanium, gallium arsenide (GaAs), an alloy of silicon and germanium, or indium phosphide (InP) and the like. The main surface serves as a foundation upon which electronic devices such as integrated circuits (ICs) are deposited and electrically interconnected. The optical proximity sensor arrangement can be fabricated in a semiconductor process at wafer level.

The first integrated circuit comprises at least one light sensitive component and is arranged on the substrate at or near the main surface. The light sensitive component may be a semiconductor device that converts light into current such as a photodiode. The term "light" hereinafter denotes electromagnetic radiation including the infrared, visual and ultraviolet (UV). For example, an infrared photodiode is used in optical proximity sensors. The first integrated circuit may not only comprise the at least one light sensitive component. Other electronic components such as terminals, a driver circuit, A/D converter, i.e. generally means to operate the at least one light sensitive component may be implemented.

The second integrated circuit comprises at least one light emitting component which is arranged on the substrate at or near the main surface. The light emitting component may be a semiconductor device that emits light when activated, for example, a light emitting diode, such as an infrared emitting diode. The emission may be continuous or pulsed. The second integrated circuit may not only comprise the at least one light sensitive component. Other electronic components such as terminals, a driver circuit, A/D converter, i.e. generally means to operate the at least one light emitting component may be present. Both first and second integrated circuits are arranged on the same substrate.

The light barrier is arranged between the first and second integrated circuits. The light barrier is designed to block light to be emitted by the at least one light emitting component from directly reaching the at least one light sensitive component. The light barrier may be a semiconductor structure or part of an optical package of the optical proximity sensor arrangement. For example, the package can be fabricated by means of molding or 3D packaging. The light barrier may be complemented by using small air gaps with respect to a cover, rubber boots, specially inked apertures on a cover of a mobile device, and specially shaped apertures on shields arranged on top of the optical proximity sensor arrangement.

The multilayer mask is arranged on or near the first integrated circuit. The mask comprises a stack including at least a first and a second layer. However, the mask may comprise further layers, for example. The first layer comprises a set of first elongated light blocking slats and the second layer comprises a set of second elongated light blocking slats. The term "elongated", or lengthwise, denotes that the slats have a principal direction longer than the other dimensions. The slats may have a light blocking material or could be coated with layers of light blocking material, for example.

The light blocking slats in the different layers are arranged in the mask to block light from reaching the light sensitive component. If light is incident on the mask from a first region of incidence, it may be blocked. Light which is incident on the mask from a second region of incidence, however, is passed and allowed to reach the light sensitive component. Openings in the mask result from arranging the slats in view of these optical constraints. The openings in the mask are confined by the slats and determine whether light is blocked or passed along a given optical path. In the following the term "angle of incidence" will be given its common definition from geometric optics. The angle of incidence is the angle between a ray incident on a surface and the line perpendicular to the surface at the point of incidence, called a normal.

For practical use the optical proximity sensor arrangement is typically embedded into an optical package and built into a larger device such as a smartphone or tablet. Typically the sensor arrangement resides below a cover made from glass or plastic. During operation the light emitting device from the optical proximity sensor emits light towards an object to be detected. Typically emission is pulsed for a certain duration. The light sensitive component detects light from the light emitting component that has been reflected back off an object to be detected. In any case the emitted light has to pass through the cover in order to eventually reach the object or target. To a certain amount this leads to reflections off of the inside and outside surfaces of the cover.

The light blocking slats are arranged to only pass light from the second region of incidence angles. In fact, the slats can be intentionally sized and oriented with the purpose of blocking offending crosstalk rays originating from reflections off of the cover. In fact, controlling specular crosstalk with layers of slats instead of with inked apertures, rubber boots, and restricted shield apertures can further improve signal-to-noise ratio and accuracy of optical proximity detection.

The slats can be distributed in the mask by defining the layers without the need of staggered walls connected by vias, for example. Vias, like through-substrate-vias, are optional structures and can be used to ground the slats or layers to reduce the risk of trapped charge in the sensor arrangement. Furthermore, this allows light to impinge from more directions, significantly improving the light gathering and sensitivity of the proximity sensor.

The exact size, distance and orientation of slats in the respective layer typically is a result borne out by optical simulation or ray tracing software such as TracePro or Zemax. The slat orientation allows specific targeting of the "problem" rays, i.e. it blocks specularly reflected rays coming from the cover, while otherwise opening up the angular aperture to receive light from other directions, resulting in improved optical signal and sensitivity. Tailoring the design specifically to block offending crosstalk rays allows more precise control of the package performance, as layer geometry can be controlled very precisely in fabrication at wafer level, for example. This helps alleviate problems of crosstalk caused by system level variations such as customer air gap, customer misalignment of inked apertures etc. It also results in improved light gathering efficiency. In fact, suppressing crosstalk with layered slat structures such as the suggested mask allows system apertures that were reduced and shaped to control optical crosstalk in other designs to be opened up larger.

In at least one embodiment the first region of incidence comprises angles of incidence which are restricted to a cone of incidence. This cone of incidence is defined with respect to a surface normal of the mask. Furthermore, the second region of incidence comprises angles of incidence which are restricted to angles greater than those of the first region.

Typically, the angles of incidence are defined with respect to a surface normal of the mask.

The first region is a function of distance between the light emitting component and the light sensitive component, for example. Typically, the angles of incidence in the first region are restricted to a cone of smaller opening angle if the light emitting component and the light sensitive component are spaced close to each other. In other words the size, distribution and distance of light blocking slats in the different layers can also be a function of distance between the light emitting component and light sensitive component. Correspondingly, specularly reflected light from the cover can be suppressed by the rays having an incident angle from the first region. Rays having an incident angle from the second region, which are not specularly reflected off of the cover, can reach the light sensitive component for detection.

In at least one embodiment the first and the at least one second layer of elongated light blocking slats have different distances with respect to the main surface. The light blocking slats from the second layer and the light blocking slats from the first layer are offset with respect to each other and along a direction parallel to the main surface. The first and second regions of incidence are defined by the offset of light blocking slats.

There are several parameters that can be adjusted in order to define the optical properties of the multilayer mask. Among these parameters are the length (or elongation) and size of the light blocking slats, the distance within the same layer, the distance between different layers and orientation of the slats, within the same layer and within different layers, and distance of the mask with respect to the cover.

By offsetting slats from different layers having a distance with respect to each other, channels can be defined within the mask. These channels open optical paths in the mask. Within the optical constraints defined for the multilayer mask these optical paths point towards the light sensitive component for light incident on the mask from within the second region of incidence. Light that originates from the first region of incidence, however, cannot propagate along these channels and their respective optical paths. As a consequence light cannot reach the light sensitive component or at least gets attenuated to a high degree. Overall this leads to a reduction in optical crosstalk due to specularly reflected light from the cover.

In at least one embodiment the elongated light blocking slats in the first and the at least one second layer are oriented along their elongation facing into a common direction, respectively. Pairs of elongated light blocking slats in the first and the at least one second layer are regularly spaced such as to confine trenches along the common direction, respectively. The elongated light blocking slats and trenches define channels in the mask. The channels have an opening angle which, in turn, defines the second region of incidence.

The light blocking slats in the multilayer mask define optical paths within the mask in at least a twofold manner. First, the slats are aligned vertically, i.e. within the respective layers having different distances with respect to each other, and, second, by pointing in to the common direction. By pointing towards the common direction suppression of optical crosstalk can be further fine-tuned. The regular spacing and forming of trenches leads to channels in the multilayer mask which point towards the light sensitive component. However, these channels are open from two different sides. This increases the amount of energy that is allowed to reach the light sensitive component from incoming race of the second region of incidence.

In at least one embodiment the light blocking slats from the second layer and the light blocking slats from the first layer are offset with respect to each other. The offset is arranged such that the at least one light sensitive component is at least partly or completely covered when viewed along a surface normal of the mask. In fact, if viewed from the top side of the optical proximity sensor arrangement the light sensitive component is covered from all angles that lie within the cone of incidence defining the first region of incidence. Only if viewed from larger angles, i.e. from an angle of the second region of incidence certain light paths (as defined by the channels and trenches confined by them light blocking slats) open up and allow light to reach the light sensitive component.

In at least one embodiment the channels defined by the elongated light blocking slats and trenches have a two-sided opening angle.

In at least one embodiment the first layer of first elongated light blocking slats is arranged close to or directly on the at least one light sensitive component. The first layer at least partly covers the at least one light sensitive component.

In at least one embodiment the elongated light blocking slats are arranged into the first and second layer, respectively.

In at least one embodiment in the mask comprises one or more further second layers each comprising a set of second elongated light blocking slats. The further second layers can be aligned with respect to each other and define a third, fourth, fifth, and so on layer in the multilayer mask. The definition and alignment of these layers allows for the degrees of freedom in the optical design of the multilayer mask. Thus, the optical crosstalk due to specularly reflected light can be further reduced.

In at least one embodiment the second elongated light blocking slats in the one or more further second layers each comprise second elongated light blocking slats having different distances with respect to the main surface. The second elongated light blocking slats from the further layers are aligned along the surface normal of the mask.

In at least one embodiment the slats metal slats and/or glass slats. For example, when using glass a light blocking layer can be spun onto the glass for increased light blocking.

In at least one embodiment the at least one light sensitive component is at least partly covered by a field oxide. The first layer of first elongated light blocking slats is arranged on the field oxide. The second layer or a plurality of second layers are arranged in an interlayer oxide. In oxide layer passivation layer is arranged on the top side of the mask.

In at least one embodiment the at least one light sensitive component is placed in a back focal plane of a lens. An aperture shield is arranged at or near a top side of the lens. The shield comprises at least one elongated light blocking area and one or more light passing areas. The light passing areas are confined by the elongated light blocking area.

For example, the lens can be molded onto the light emitting component. In case of a light emitting diode often such a lens is already integrated into the diode design. By means of the aperture shield the radiation pattern automation pattern of the light emitting component can be altered. By arranging the elongated light blocking area, for example, centered on the lens, those rays of light can be suppressed on the emission side that could otherwise lead to a larger amount of specular reflection off of the cover.

In at least one embodiment the elongated light blocking area comprises a circular or rectangular bond pad of the at least one light emitting component. Using the bond pad provides a convenient means to use the same manufacturing processes that already are present to bond the light emitting component to also arrange the aperture shield to reduce specular reflections.

In at least one embodiment a method for producing an optical proximity sensor arrangement comprises the following steps. First, the semiconductor substrate, having a main surface, is provided. The first integrated circuit is provided comprising at least one light sensitive component. The first integrated circuit is arranged on the substrate at or near the main surface. A second integrated circuit is provided and comprises said least one light emitting component. The second integrated circuit is arranged on the substrate at or near the main surface. Furthermore, a light barrier is arranged between the first and second integrated circuits. The light barrier is designed to block light to be emitted by the at least one light emitting component from directly reaching the at least one light sensitive component.

Finally, a multilayer mask is arranged on or near the first integrated circuit. The mask comprises a stack of a first layer and a second layer. The first layer comprises first elongated light blocking slats and the second layer comprises second elongated light blocking slats. The light blocking slats are arranged in the mask to block light which is incident on the mask from the first region of incidence. Furthermore, the light blocking slats are also arranged to allow light to pass which originates from a second region of incidence to reach the at least one light sensitive component.

BRIEF DESCRIPTION OF THE DRAWINGS

In the following, the concept presented above is described in further detail with respect to drawings, in which exemplary embodiments are presented.

FIG. 10 shows an embodiment of a method for producing an optical proximity sensor arrangement.

DETAILED DESCRIPTION

Figure 1:
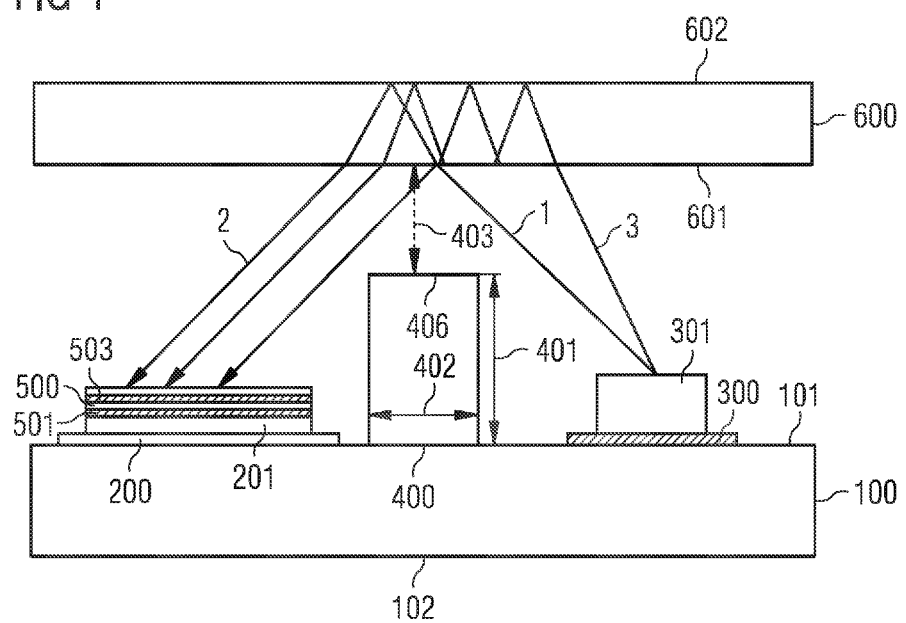
FIG. 1 shows a side view of an embodiment of an optical proximity sensor arrangement.

FIG. 1 shows a side view of an embodiment of an optical proximity sensor arrangement.

The drawing depicts an optical proximity sensor arrangement embedded in a larger device such as a smartphone or tablet. The optical sensor arrangement comprises a substrate 100 having a main surface 101 which extends into an X- and Y-direction. Arranged on the main surface 101 is a first integrated circuit 200, a second integrated circuit 300 and an optical light barrier 400 arranged in between these circuits. Typically, the light barrier 400 is centered with respect to a center point 405 between the first integrated circuit 200 and the second integrated circuit 300 (see FIG. 2).

The first integrated circuit 200 comprises at least one light sensitive component 201. In this particular embodiment the light sensitive component is a photodiode. The first integrated circuit 200 further comprises terminals (not shown) for electrically connecting the photodiode through the substrate 100. For example, through-substrate vias or wire bonds can be used to provide electrically conductive connections to a backside 102 of the substrate 100. Contacting from the backside 102 can be achieved by bumps (not shown), for example.

The photodiode has a light sensitive area (an N-well, for example) which is covered by a multilayer mask 500. The multilayer mask 500 comprises several layers 501, 503, 505 which will be discussed in more detail in the following figures. The second integrated circuit 300 comprises a light emitting component 301. In this particular embodiment the light emitting component 301 is a light emitting diode which may, optionally, be provided with a lens 302 (not shown). For example, the light emitting diode emits light in the infrared.

Arranged in between the first and second integrated circuits 200, 300 the light barrier 400 has a height 401 and width 402 which are adjusted to block light emitted from the light emitting diodes from directly reaching the photodiode. The light barrier 400 also has a length 404 which may span over the entire main surface 101 of the substrate 100. However, the length 404 can also be smaller, depending on the optical constraints. The light barrier 400 is made in a semiconductor process or by means of molding a light blocking molding material between the integrated circuits 200, 300, for example. Furthermore, the light barrier 400, if implemented into a larger device, is positioned below a cover 600 (in a Z-direction). The distance between an underside of the cover 601 an upper side 406 of the light barrier 400 is denoted an air gap 403.

In operation the optical proximity sensor arrangement emits light towards a target or object to be detected (not shown). The light emitting diode 301 may emit light in a pulsed fashion. For better representation characteristic rays of light 1, 2, 3 are depicted in the drawing. Typically the rays of light need to pass the cover 600 in order to be able to reach the light detecting photodiode, for example after being reflected at an object or target to be detected.

The first characteristic ray 1 is specularly reflected off of the cover 600. After the ray is reflected on the underside 601 of the cover 600 it eventually reaches the multilayer mask 500. Parts of this first characteristic ray 1 may, however, be refracted into cover 600 and can be reflected on an upper side 602 of the cover. This situation is depicted as characteristic ray 2. This reflected ray 2 may leave again the cover 600 at the underside 601 and eventually reaches the multilayer mask 500. A third characteristic ray 3 is also depicted. The light ray 3 is also entering the cover 600 and is reflected multiple times between the underside and upper side 601 and 602 until it finally leaves the cover 600 and eventually is incident on the multilayer mask 500.

Figure 2:
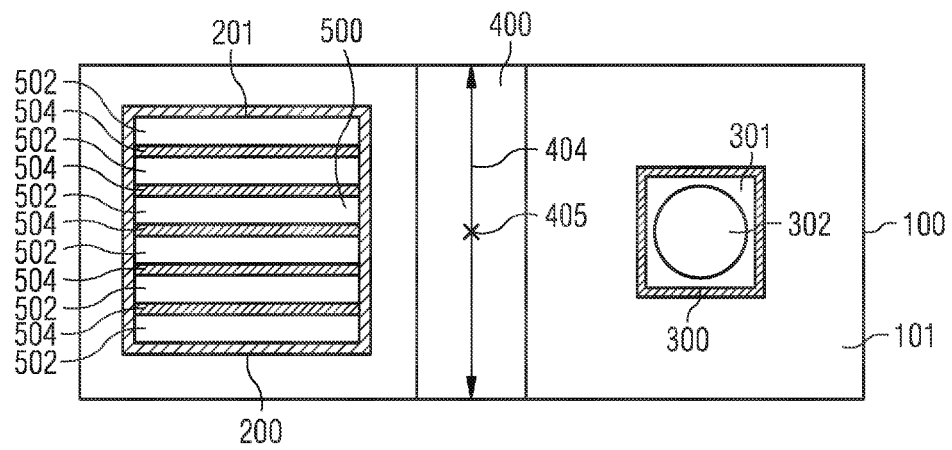
FIG. 2 shows a top view of an embodiment of an optical proximity sensor arrangement.

FIG. 2 shows a top view of an embodiment of an optical proximity sensor arrangement.

The multilayer mask 500 comprises a first layer 501, a second layer 503 and a third layer 505 which are stacked to form the multilayer mask 500. Please note that the second layer 503 cannot be seen in the drawing as it resides below the third layer 505. The layers 501, 503, 505 are embedded into an intermediate layer 507 such as an interlayer oxide, for example. The layers in the stack have a distance with respect to each other, which may be the same between all layers.

Each layer 501, 503, 505 comprises a set of elongated light blocking slats 502, 504, 506, respectively, which, along their respective elongation axes, are oriented into a common direction. For example, in this embodiment the slats are oriented in parallel along the Y-direction and facing towards the light emitting diode 301, thus placing the common direction into the infinity. However, the common direction can also be centered on the light emitting diode 301, for example. Then the slats are not parallel but, along their respective elongation axes, are converging towards the common direction.

The slats from a given layer 501, 503, 505 are arranged to confine respective trenches 508, 509 between the individual slats. In a similar way that the elongated slats are oriented and face towards the common direction also the trenches 508, 509 are oriented and face into the same direction. However, the elongated slats from the second and third layer 503, 505 are horizontally offset, i.e. in a direction parallel to the main surface 101 of the substrate 100.

The multilayer mask 500 is arranged for only letting rays from a defined region of incidence reach the light sensitive photodiode. This optical property of the mask is largely defined by the geometry and orientation of the slats and layers. The offset is one parameter to adjust the optical properties of the multilayer mask 500 and will be discussed in more detail with respect to the following figures.

Figure 3:
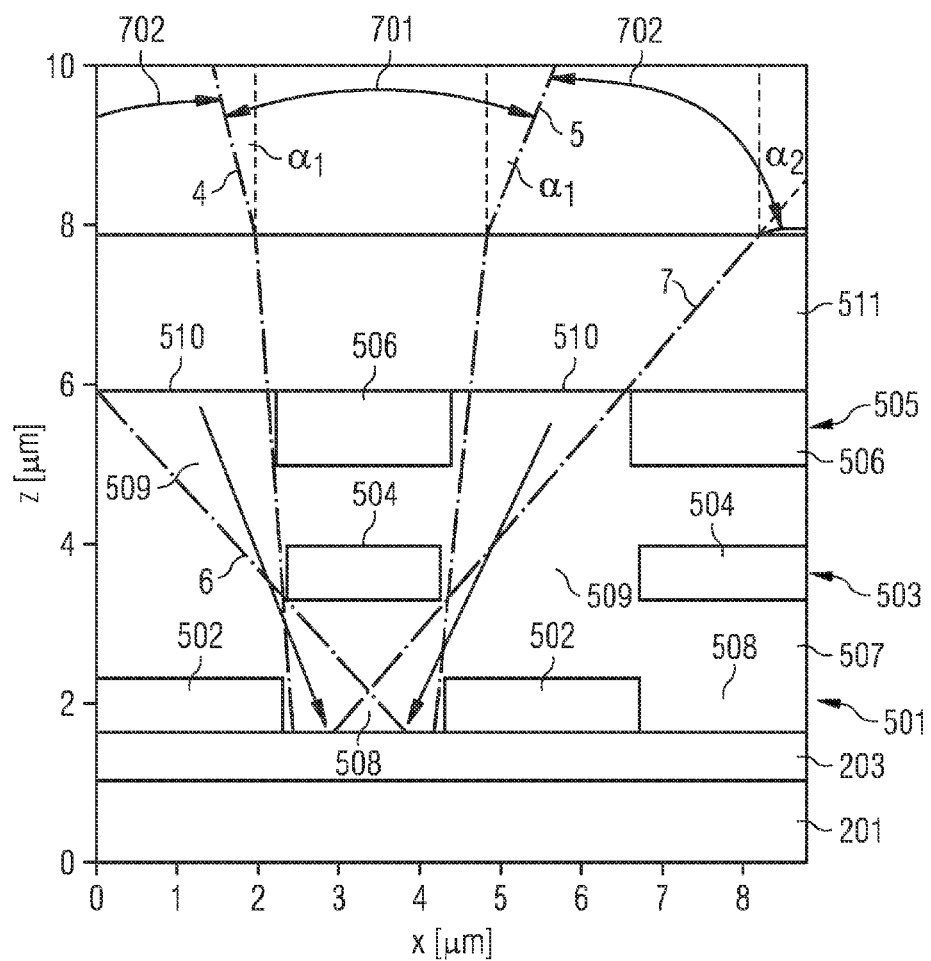
FIG. 3 shows a sectional view of an embodiment of a multilayer mask.

FIG. 3 shows a sectional view of an embodiment of a multilayer mask.

The sectional view shows a part of the first integrated circuit 200 represented as the light sensitive component 301 or by an N-well of a photodiode. The N-well is covered by a field oxide layer 203. Arranged on the field oxide layer 203 is the first layer 501 from the multilayer mask 500. Depicted are sections of two elongated slats 502. In this particular embodiment these elongated slats 502 have a width of about 2 micrometers and a height of about 0.5 micrometers. Furthermore, the first elongated slats 502 are made from metal, such as aluminum. In the drawing only two elongated slats are depicted for easier representation. These slats are arranged with a separation distance and define trenches 508 between each other. The drawing, however, only shows part of the multilayer mask 500. The number of elongated metal slats can be more than two and is only limited by the available space and optical properties intended for a given optical application. For example, there may be some 10, 100 or 1000 or more elongated metal slats present in each of the layers in the multilayer mask 500.

The second layer of elongated slats 503 comprises elongated slats 504 which are oriented and arranged in a similar fashion and then those of the first layer 501. In fact, the elongated slats 504 also made from the same metal and have a similar width and height as those from the first layer 501. As can be seen from the drawing, however, the slats 504 from the second layer 503 are offset along a horizontal direction.

The third layer 505 of elongated slats comprises a set of elongated slats 506 which are oriented and arranged in a similar fashion and then those of the first and second layers 501, 503. In fact, the elongated slats 506 also made from the same metal and have a similar width as those from the first and second layers 501, 503. Their height may be somewhat thicker than the underlying layers, for example 1 micrometer. As can be seen from the drawing the slats 506 are also offset along the horizontal direction and with respect to the slats from the first layer 501. There's no offset, however, with respect to the slats 504 from the second layer 503. Rather the elongated slats 504, 506 from the second and third layer 503, 505 are aligned with respect to each other and along a vertical axis (in the Z-direction).

The layers 501, 503, 505 are all embedded in an intermediate layer 507 which, in this embodiment, is an interlayer oxide. In other words, the multilayer mask 500 comprises the layers of elongated slats 501, 503, and 505 and also the intermediate layer. On the top surface 510 of the multilayer mask 500 an additional layer 511, for example an oxide or passivation layer, is distributed.

The optical characteristics of the multilayer mask 500 depends on various parameters such as the geometry and orientation of the slats in the different layers and their respective distances. In practice, the optical layout typically is the result of optical simulation or ray tracing simulation, for example, conducted with software such as Trace Pro or Zemax. However, the basic optical properties of the mask 500 can be understood by following typical light paths of light incident on the multilayer mask.

Light can be incident on the multilayer mask from within a first region of incidence 701. Incoming rays from this region are blocked by the elongated slats 504 and 506, respectively. The first region of incidence 701 can be represented by a common which are confined by a maximum angle of incidence α1. Light rays 4 and 5, indicated by dashed lines in the drawing, represent optical paths along this maximum angle of incidence α1. Following these rays 4, 5 the light is refracted at the air/oxide layer interface. After penetrating the oxide layer 511 the light exits the oxide layer close to one of the elongated slats 506 in the third layer 505. After being refracted at this interface the rays 4, 5 pass the elongated slats 504 in the second layer 503. Because of the offset between the slats in the first layer 501 and those in the second and third layers 503, 505 the rays 4, 5 eventually reach the trenches 508 in the first layer 501. This way the rays 4, 5 can reach the light sensitive surface 301 of the first integrated circuit 300, e.g. the N-well of the photodiode. Incoming rays having an angle of incidence which is smaller than the maximum angle of incidence α1, however, are blocked either by the slats 506, 504 in the third and second layer 503, 505 or by one of the slats 502 in the first layer 501.

The maximum angle of incidence α1, and thereby, the first region of incidence 701, are a function of several parameters: the width and height of the elongated slats 504, 506 in the second and third layers 503, 505 and the distance between the second and third layers 503, 505. Furthermore, the maximum angle of incidence is also defined by the width of trenches 508 in the first layer 501, i.e. by the width and height of the elongated slats 502 in the first layer 501 as well as their distance with respect to the second and third layers 503, 505. Finally, the maximum angle of incidence α1 is also a function of the offset of slats 502 in the first layer 501 with respect to the slats 504, 506 the second and third layers 503, 505.

Light can be incident on the multilayer mask 500 from within a second region of incidence 702. The second region 702 is confined by the maximum angle of incidence α1 introduced above on one side and a minimum angle of incidence α2 on the other side. A ray of light 6, 7 incident under the minimum angle of incidence α2 is allowed to reach the photodiode as it passes through all trenches 508, 509 in the first, second, and third layers 501, 503, 505 of elongated slats. The minimum angle of incidence α2 is defined by the same parameters as the maximum angle α1. Thus, incoming 6, 7 rays are accepted from the second region of incidence 702.

The maximum and minimum angles of incidence α1, α2 define channels in the multilayer mask 500. In fact, the structure defines a two-sided opening angles of the channels and allows light to enter from both sides (right and left) of the trenches 508, 509, while blocking offending crosstalk rays. This allows to block a large amount of offending optical crosstalk, while allowing for a significantly increased proximity signal, by virtue of letting more light in. For example, the width of elongated slats decreases with distance from the top side of the multilayer mask 500 towards the first layer.

Figure 4:
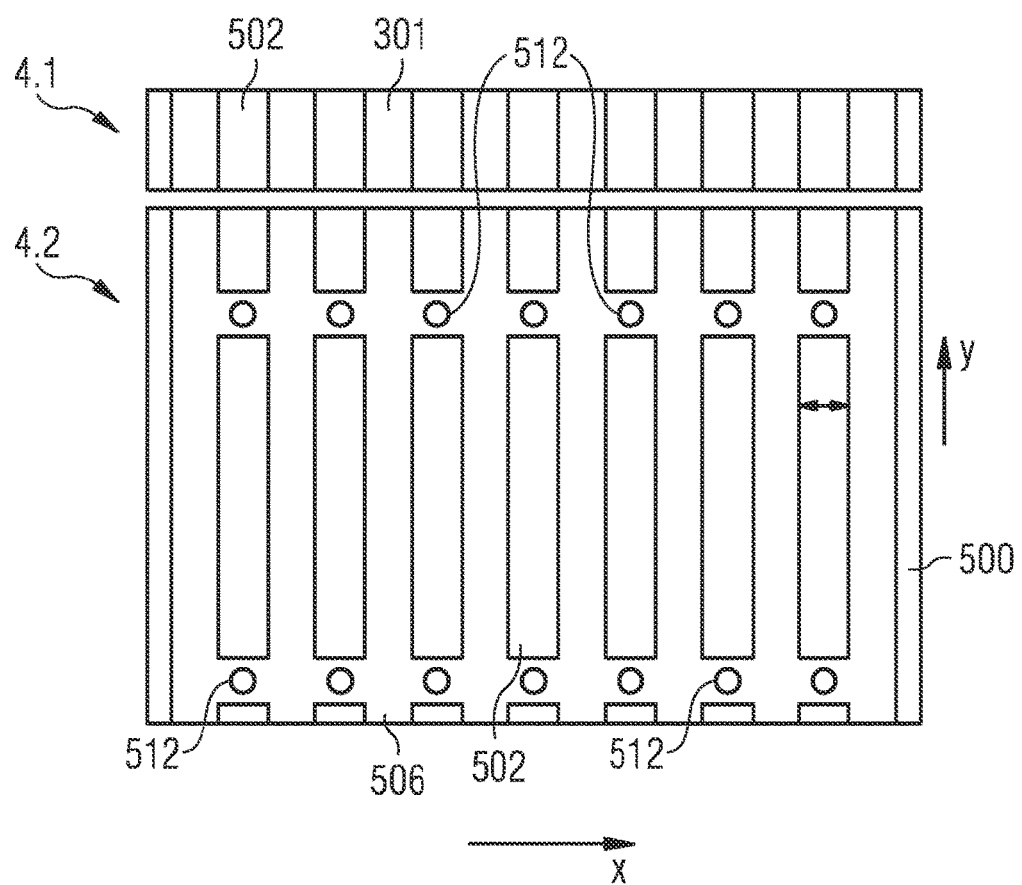
FIG. 4 shows a top view of an embodiment of a multilayer mask.

FIG. 4 shows a top view of an embodiment of a multilayer mask. In fact, the drawing shows two top views 4.1 and 4.2 which are orientated along the X- and Y-orientation.

The upper part of the drawing 4.1 shows an embodiment of a multilayer mask 500 with the second and third layers 503, 505 removed. Only the slats 502 of the first layer 501 are shown. Clearly visible are the trenches 508 between the slats 502 which reveal the underlying photodiode 301.

The lower part of the drawing 4.2 shows an embodiment of the same multilayer mask 500 but with the second and third layers 503, 505. The slats in the second and third layers are arranged in stripes. Only the set of third elongated slats is visible in the drawing. The stripes are interrupted by vias 512 (depicted as circles) in the first layer 501, i.e. the first slats 502. The vias 512 allow to electrically ground the layers so as to avoid problems with trapped charge, for example.

When viewed from an on-axis perspective, i.e. in top view perpendicular from the top surface 510 of the mask 500, then the photodiode and its light sensitive surface 301 lie hidden behind the second and third layers 503, 505. The same is true if viewed from any angle of the first region of incidence 701. The photodiode is only visible from an off-axis perspective in the +X- or −X-direction, e.g. when viewed under an angle from the second region of incidence 702.

Figure 5:
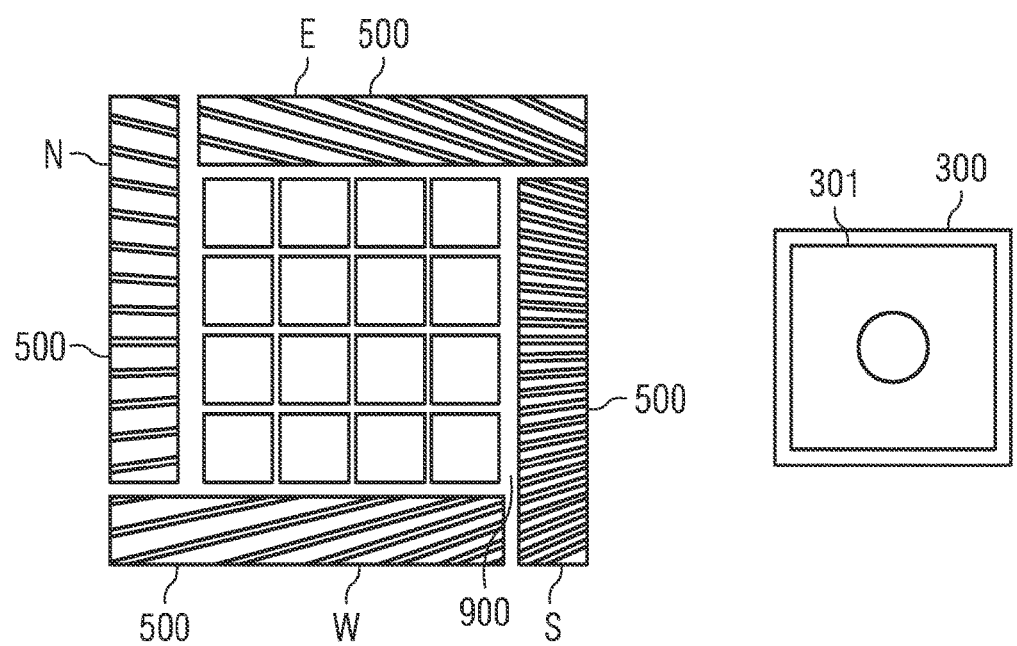
FIG. 5 shows a top view of another embodiment of an optical proximity sensor arrangement.

FIG. 5 shows a top view of another embodiment of an optical proximity sensor arrangement.

The drawing shows an optical proximity sensor arrangement combined with a color sensor 900. A color sensor array is arranged around a center of the sensor arrangement. The array comprises sensor elements such as photodiodes which are sensitive to different parts of the spectrum or to different colors, e.g. by means of different filters. A set of four integrated circuits 200 having respective light sensitive components 201 are arranged around the center color sensor array. For example, these light sensitive components are photodiodes N, S, E, and W. Each of these integrated circuits or photodiodes carries a respective multilayer mask 500 along the concepts presented above.

As indicated in the drawing the slats are oriented pointing towards a center of a light emitting diode 301 arranged at the right side of the drawing. Alternatively to pointing at the light emitting diode 301 it may suffice to put all the slats oriented horizontally, i.e. the spatially varying "slew" angle deviations shown in FIG. 5 may not be necessary but rather constitute an ideal implementation. The structure shown can be shown to block most of the offending optical crosstalk, while allowing for a significantly increased signal-to-noise ratio, by virtue of more light to reach the light sensitive components of the sensor arrangement. In other words the embodiment of FIG. 5 shows an optically ideal embodiment, although it may not be as appealing from a layout standpoint. Here some spatial variation of the slat orientation is allowed so that all areas of the detector have slats pointed directly at the centre of the light emitting diode, as from a "top view" perspective. However, as long as the light emitting diode and detector N, S, E, W are well spaced so as to limit the angular deviation about the connecting axis (along X-direction), it would likely suffice to simply orient all of the elongated slats in the same direction.

Figure 6:
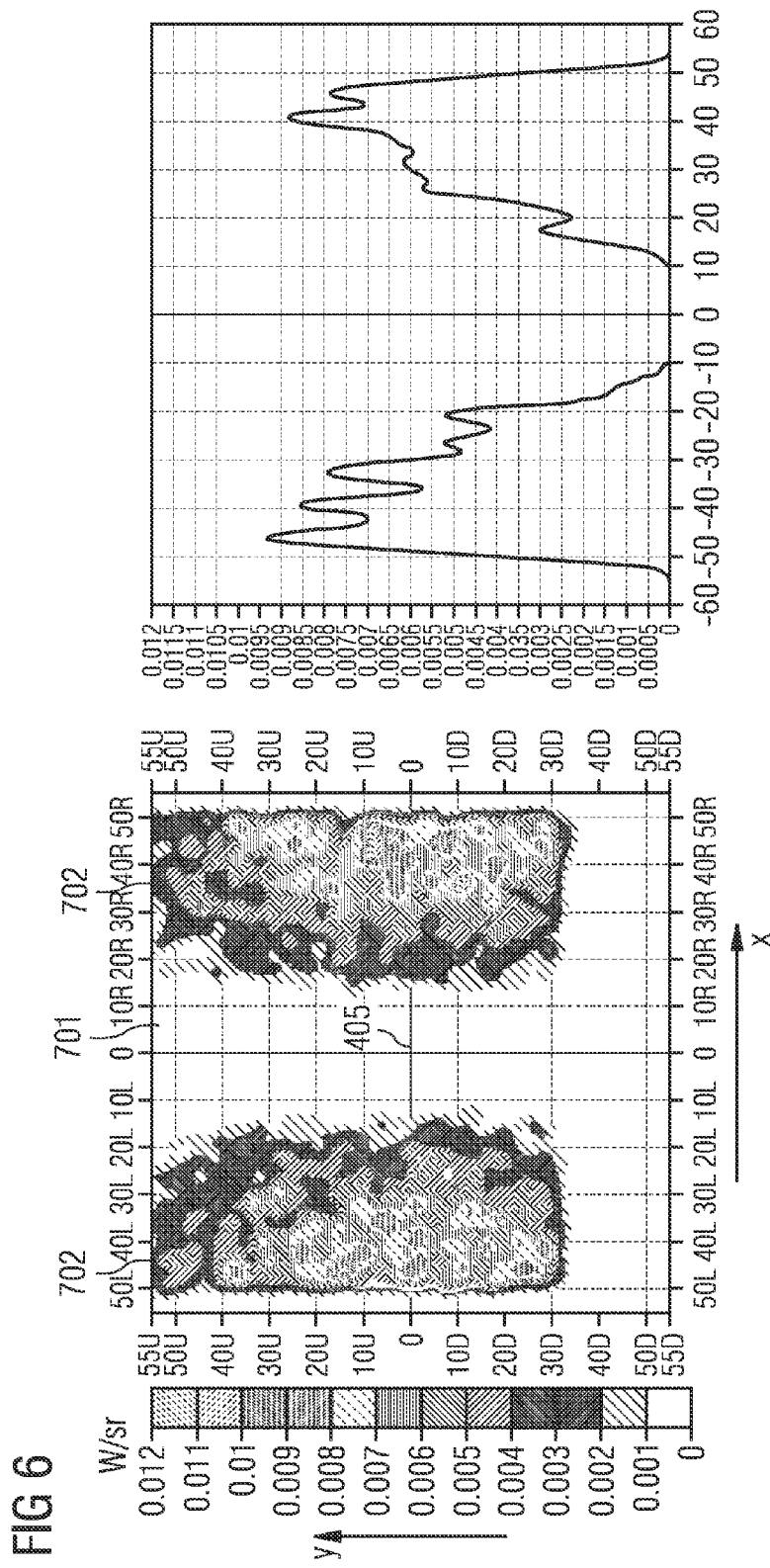
FIG. 6 shows experimental results of an embodiment of an optical proximity sensor arrangement having a multilayer mask.

FIG. 6 shows experimental results of an embodiment of an optical proximity sensor arrangement having a multilayer mask.

The two graphs show results of an optical simulation of the structure in presented in FIG. 5. The graph on the left side represents an angular spatial chart and is known as Candella Plot in optical simulation software like TracePro. The X- and Y-axes directions correspond to the X, Y orientation of the optical proximity sensor arrangement. Furthermore, the axes also represent angles from which light is incident after being reflected from the cover 600. The graph on the right side represents a slice along the X-direction.

Offending crosstalk rays generally reside in the vicinity of a plane that is perpendicular to the cover glass, whereas the plane also intersects both the centre of the light emitting diode and the centre 405 of the proximity sensor. The proposed solution specifically sets out to block these problem rays coming from the first region of incidence 701, while allowing light impinging on the proximity sensor from other directions such as the second region of incidence 702 to pass.

The simulation shows the sensor arrangement of FIG. 5 but instead of covering the entire light sensitive components 301, e.g. the sensitive photodiode area, with the mask 500, a small structure (with underlying small sensor area) was placed at the centre of the North facing Diode N. The simulation shows the resulting angular field of view of that test structure. Note how the angular field of view completely excludes the "problem rays" from the first region 701, i.e. the structure effectively blocks the offending specular crosstalk rays while passing large amounts of energy from incoming rays at other angles from the second region 702.

Figure 7:
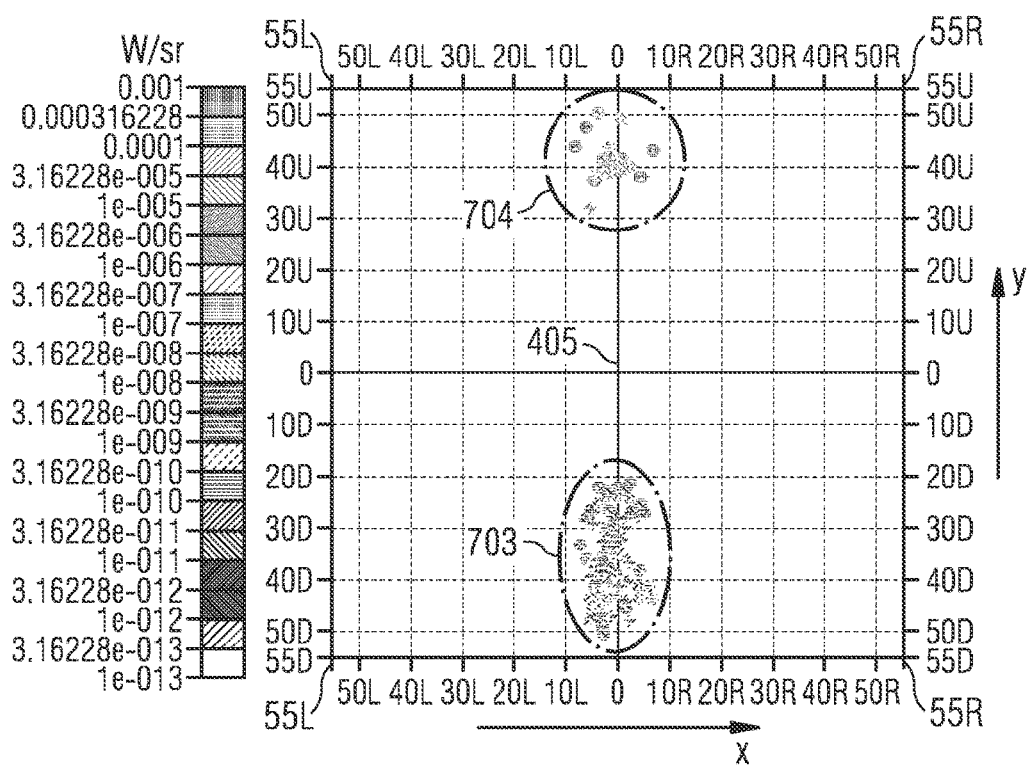
FIG. 7 shows experimental results of an embodiment of an optical proximity sensor arrangement having no multilayer mask.

FIG. 7 shows experimental results of an embodiment of an optical proximity sensor arrangement having no multilayer mask.

The same simulation has been repeated but without any mask 500 in place. Again, the simulation only show the North facing diode N as it often suffers more from crosstalk than the other three diodes S, E, W, due to the nature of the specular reflection paths. The optical simulation on this altered model produced large optical crosstalk signals. The "problem rays" involved in the optical crosstalk are depicted in the simulation result in Candella plot representation. Analysis reveals that most of the crosstalk energy actually bounces off of the outside surface 602 of the cover glass 600, whereas some of the crosstalk rays also bounce from the inside surface 601.

It can be seen that the crosstalk rays lie in a relatively narrow region that has an angular extent of roughly+/−10 degrees in the "horizontal", or azimuthal extent. There are two clusters 703, 704 of ray angles. The main cluster 703 results from specular rays bouncing directly from the glass to the detector. The second cluster 704 is much less significant, but results from rays that bounce back from "behind", bouncing either off of the vertical wall of the flat lens that covers the detector, or from the black painted wall (considered 10% diffusely reflective) of the inside of a metal shield 303.

With no lens over the light emitting diode the geometry of FIG. 5 could pretty well predict the angular bounds of these offending rays due to the specular nature of the reflection off of the glass 600. As viewed from above the rays appear to travel in a straight line from the light emitting diode to the detector. A certain range of ray "azimuth" angles contribute to crosstalk, based on simple geometry. The fact that there is actually a lens over the light emitting diode alters this somewhat but the concept still provides a better intuitive understanding of the situation. For example, if the light emitting diode to detector N, S, E, W spacing is increased, the range of problematic azimuth angles will decrease. If the light emitting diode size is reduced, this will also help.

Figure 8:
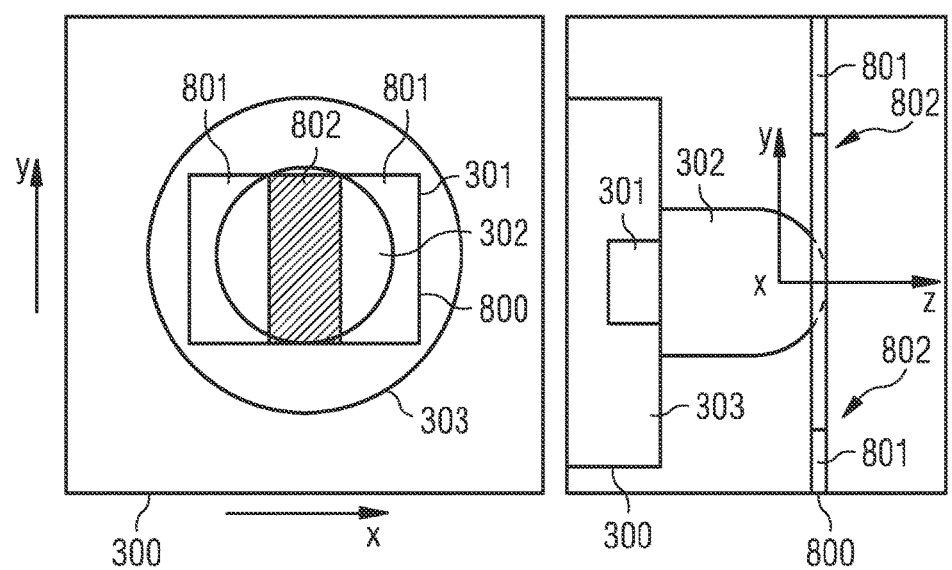
FIG. 8 shows an embodiment of a light emitting diode in an optical proximity sensor having a lens and attached aperture shield.

FIG. 8 shows an embodiment of a light emitting diode in an optical proximity sensor arrangement having a lens and attached aperture shield.

The drawing shows a top view of the optical proximity sensor arrangement on the left side and a sectional side view on the right side. Only the second integrated circuit 300 is shown. In fact, the optical sensor arrangement resides in an optical package which is not depicted for easier reference. Only a metal shield 303 is depicted as a representation and serves as an aperture in the package. The light emitting component 301, for example, the light emitting diode, is arranged and centered with respect to the metal shield 303. Furthermore, a lens 302 is arranged on top of the light emitting component 301 and is centered as well. On the top surface of the lens 302 an aperture shield 800 is arranged. The aperture shield 800 comprises a central elongated light blocking area 802 and one or more light passing areas 801 confined by the elongated light blocking area 802.

The concepts for control of optical crosstalk discussed so far rely on using a detector that excludes specularly-reflected crosstalk energy. Using the aperture shield 800 it is also possible to provide control from the emission side of the proximity device. FIG. 8 shows such a modified layout where rays are directed away from the specular crosstalk direction.

Typically, it is difficult to tightly control the angular profile of a light emitting component 301, such as a light emitting diode, because the active area of the light emitting diode is typically quite large with respect to the lens diameter and the maximum allowed depth of the optical package. In this example, the light emitting diode directivity was accomplished in the most direct way. By placing the light emitting diode in the back focal plane of the lens 302, the angular radiation pattern is essentially an image of the active emitting area of the light emitting diode. Thus, by expanding the normal circular light emitting diode bond pad into a rectangular region, i.e. the elongated light blocking area 802, the large bond pad defines a region where no light is emitted from the light emitting diode surface 301. This results in an angular emission pattern that does not emit as much light in the directions that result in specular optical crosstalk.

Figure 9:
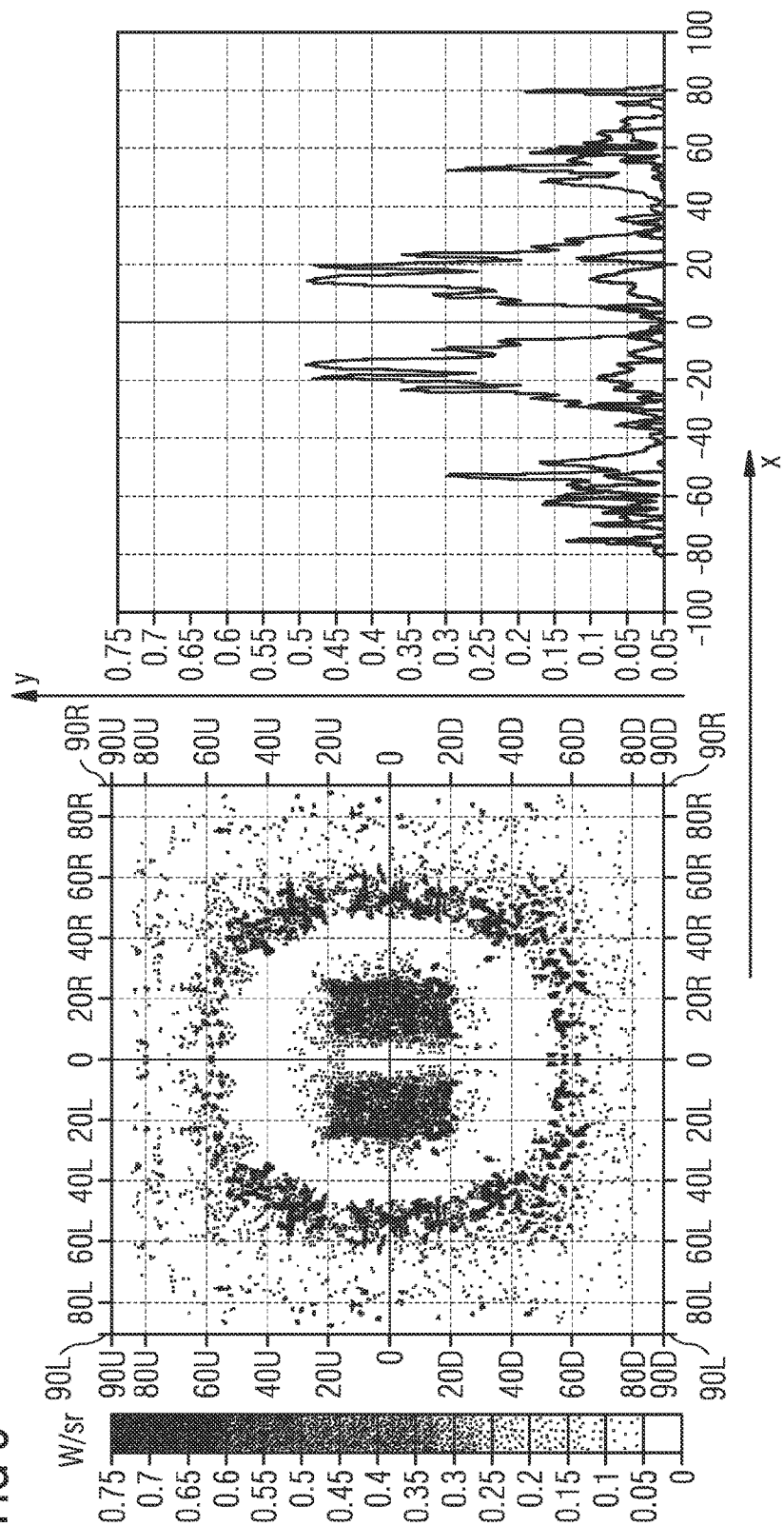
FIG. 9 shows experimental results of an embodiment of an optical proximity sensor arrangement having a lens and attached aperture shield.

FIG. 9 shows experimental results of an embodiment of an optical proximity sensor arrangement having a lens and attached aperture shield.

The graphs shows the results of an optical simulation of the light emitting diode structure shown in FIG. 8. The angular distribution of the radiated optical energy is represented again in a Candella plot. The light emitting diode, coupled with the detector discussed with respect to FIG. 8 can further suppress optical crosstalk caused by specular reflections from a cover 600. Note, however, that this type of solution typically results in lower light-gathering efficiency for the light emitting diode.

Achieving a well-controlled light emitting diode angular distribution would likely be easier with a VCSEL (Vertical Cavity Surface Emitting Laser). With a small emitting area and the relatively collimated light that is offered by a VCSEL, other solutions could be entertained, such as use of Fresnel Lenses, lenslet arrays, and other similar structures designed with a low surface profile for reduced height.

FIG. 10 shows an embodiment of a method for producing an optical proximity sensor arrangement. This graph depicts two alternate methods #1, #2 for manufacturing the elongated slats into different layers by spinning glass layers onto the intermediate layer 507. Typically, as discussed above, the elongated slats are made from a light blocking material such as metal or a coating and are distributed into the intermediate layer 507 such as an interlayer oxide. However, it is also possible to spin-on a glass and arrange the elongated slats from metal or other nonmetal blocking materials onto one or more glass layers.

On the left side of the drawing the first alternative method #1 is illustrated. This method makes use of spinning-on-glass and allows application of thicker optical space and material. Metal or other light blocking materials can be applied to the top of one or more spun-on-glass layers 512. A set of elongated slats can be distributed on a surface of these glass layers 512. In fact, multiple spun-on-glass layers 512 can be stacked for even thicker optical space and material.

Further alternative method #2 is shown on the right side of the graph. Metal or other light blocking materials are applied on top of the interlayer oxide layers 507 on the processed substrate 100, e.g. a silicon wafer. Then one or more spun on glass layers 512 then a further set of elongated metal slats of metal or other light blocking material is applied.

It is to be understood that more than two layers with sets of light blocking elongated slats can be used, such as 1, 2, 3 or more layers of elongated metal slats and/or additional layers applied to a top side of the spun-on-glass. Non-metal blocking layers include light blocking coatings, for example, products such as Fuji light shielding and black matrix filters. These are applied onto the optically transparent layers just like ordinary photoresists. Also, red and blue filters (such as those commonly used to process RGB sensors on a, color camera) can be stacked on top of each other to make a layer that blocks almost all visible light, but may still transmit some infrared light. Such non-metallic materials are designed to be spun on the wafer or substrate 100, exposed to ultraviolet light using a fine photomask, and developed to render fine featured light blocking layers.

We claim:

1. An optical proximity sensor arrangement, comprising:
a semiconductor substrate with a main surface;
a first integrated circuit comprising at least one light sensitive component, the first integrated circuit being arranged on the semiconductor substrate at or near the main surface;
a second integrated circuit comprising at least one light emitting component, the second integrated circuit being arranged on the semiconductor substrate at or near the main surface;
a light barrier arranged between the first and second integrated circuits, the light barrier being designed to block light to be emitted by the at least one light emitting component from directly reaching the at least one light sensitive component;
a multilayer mask arranged on or near the first integrated circuit and comprising a stack of a first layer of first elongated light blocking slats and at least one second layer of second elongated light blocking slats,
wherein the first and second elongated light blocking slats are arranged in the multilayer mask to block light, incident on the multilayer mask from a first region of incidence, and to pass light, incident on the multilayer mask from a second region of incidence, to reach the at least one light sensitive component;
wherein the first region of incidence comprises angles of incidence restricted to a cone of incidence defined with respect to a surface normal of the multilayer mask,
wherein the second region of incidence comprises angles of incidence restricted greater than those angles of the first region of incidence, and
wherein the first layer and the at least one second layer have different distances with respect to the main surface,
wherein the second elongated light blocking slats and the first elongated light blocking slats are offset with respect to each other and along a direction parallel to the main surface, and
wherein the first and second regions of incidence are a function of the offset.

2. The optical proximity sensor arrangement according to claim 1,
wherein the first layer of first elongated light blocking slats and the at least one second layer of second elongated light blocking slats have different distances with respect to the main surface,
wherein the second elongated light blocking slats and the first elongated light blocking slats are offset with respect to each other and along a direction parallel to the main surface, and
wherein the first and second regions of incidence are a function of the offset.

3. The optical proximity sensor arrangement according to claim 2, wherein the first and second elongated light blocking slats are oriented along their elongation and facing into a common direction, respectively,
wherein pairs of the first and second elongated light blocking slats are regularly spaced such as to confine trenches along the common direction, respectively,
wherein the first and second elongated light blocking slats and the trenches define channels in the multilayer mask, and
wherein the second region of incidence is a function of an opening angle of the channels.

4. The optical proximity sensor arrangement according to claim 2, wherein the second elongated light blocking slats and the first elongated light blocking slats are offset with respect to each other such that the at least one light sensitive component is at least partly or completely covered when viewed along a surface normal of the multilayer mask.

5. The optical proximity sensor arrangement according to claim 3, wherein channels defined by the first and second elongated light blocking slats and the trenches have a two-sided opening angle.

6. The optical proximity sensor arrangement according to claim 1, wherein the first layer of the first elongated light blocking slats is arranged close to or directly on the at least one light sensitive component, and
wherein the first layer of first elongated light blocking slats at least partly covers the at least one light sensitive component.

7. The optical proximity sensor arrangement according to claim 1, wherein the first and second elongated light blocking slats are arranged into the first layer of first elongated light blocking slats and the at least one second layer of second elongated light blocking slats.

8. The optical proximity sensor arrangement according to claim 1, wherein the at least one second layer of second elongated light blocking slats comprises multiple second layers, each of the multiple second layers comprising respective second elongated light blocking slats.

9. The optical proximity sensor arrangement according to claim 8, wherein the respective second elongated light blocking slats have different distances with respect to the main surface and are aligned along a surface normal of the multilayer mask.

10. The optical proximity sensor arrangement according to claim 1, wherein the first and second elongated light blocking slats are metal slats and/or glass slats.

11. The optical proximity sensor arrangement according to claim 1, wherein the at least one light sensitive component is at least partly covered by a field oxide,
wherein the first layer of first elongated light blocking slats is arranged on the field oxide,
wherein the at least one second layer of second elongated light blocking slats is arranged in an interlayer oxide, and
wherein an oxide layer or passivation layer is arranged on a top side of the multilayer mask.

12. The optical proximity sensor arrangement according to claim 1, further comprising a lens, wherein the at least one light sensitive component is placed in a back focal plane of the lens, and
wherein an aperture shield is arranged at or near a top side of the lens, comprising at least one elongated light blocking area and one or more light passing areas confined by the elongated light blocking area.

13. The optical proximity sensor arrangement according to claim 11, wherein the elongated light blocking area comprises a circular or rectangular bond pad of the at least one light emitting component.

14. A method for producing an optical proximity sensor arrangement, comprising the steps of:
providing a semiconductor substrate with a main surface;
providing a first integrated circuit comprising at least one light sensitive component, and arranging the first integrated circuit on the semiconductor substrate at or near the main surface;
providing a second integrated circuit comprising at least one light emitting component, and arranging the second integrated circuit on the substrate at or near the main surface;
arranging a light barrier between the first and second integrated circuits, the light barrier being designed to block light to be emitted by the at least one light emitting component from directly reaching the at least one light sensitive component;
arranging a multilayer mask on or near the first integrated circuit, wherein the multilayer mask comprises a stack of a first layer of first elongated light blocking slats and at least one second layer of second elongated light blocking slats, wherein the first and second light blocking slats are arranged in the multilayer mask to block light, incident on the multilayer mask from a first region of incidence, and to pass light, incident on the multilayer mask from a second region of incidence, from reaching the at least one light sensitive component,
wherein the first region of incidence comprises angles of incidence restricted to a cone of incidence defined with respect to a surface normal of the multilayer mask,
wherein the second region of incidence comprises angles of incidence restricted greater than those angles of the first region of incidence, and
wherein the first and second elongated light blocking slats are arranged in the multilayer mask to confine openings to determine whether light is blocked or passed along a given optical path.

15. The optical proximity sensor arrangement according claim 1, wherein the multilayer mask is only arranged on or near the first integrated circuit.

16. The optical proximity sensor arrangement according claim 1, wherein the first and second elongated light blocking slats have a principal direction or elongation along the respective layer.

17. The optical proximity sensor arrangement according claim 1, wherein the first and second elongated light blocking slats are elongated parallel to the main surface of the sensor.

18. An optical proximity sensor arrangement, comprising:
a semiconductor substrate with a main surface;
a first integrated circuit comprising at least one light sensitive component, the first integrated circuit being arranged on the semiconductor substrate at or near the main surface;
a second integrated circuit comprising at least one light emitting component, the second integrated circuit being arranged on the semiconductor substrate at or near the main surface;
a light barrier arranged between the first and second integrated circuits, the light barrier being designed to block light to be emitted by the at least one light emitting component from directly reaching the at least one light sensitive component; and
a multilayer mask arranged on or near the first integrated circuit and comprising a stack of a first layer of first elongated light blocking slats and at least one second layer of second elongated light blocking slats,
wherein the first and second elongated light blocking slats are arranged in the multilayer mask to block light, incident on the multilayer mask from a first region of incidence, and to pass light, incident on the multilayer mask from a second region of incidence, to reach the at least one light sensitive component,
wherein the first and second elongated light blocking slats are arranged in the multilayer mask to confine openings to determine whether light is blocked or passed along a given optical path,
wherein the first layer of first elongated light blocking slats and the at least one second layer of second elongated light blocking slats have different distances with respect to the main surface
wherein the second elongated light blocking slats and the first elongated light blocking slats are offset with respect to each other and along a direction parallel to the main surface,
wherein the first and second regions of incidence are a function of the offset,
wherein the first and second elongated light blocking slats are oriented along their elongation and facing into a common direction, respectively,
wherein pairs of the first and second elongated light blocking slats are regularly spaced such as to confine trenches along the common direction, respectively,
wherein the first and second elongated light blocking slats and trenches define channels in the multilayer mask, and wherein the second region of incidence is a function of an opening angle of the channels.

* * * * *

UNITED STATES PATENT AND TRADEMARK OFFICE
CERTIFICATE OF CORRECTION

PATENT NO. : 10,629,576 B2
APPLICATION NO. : 15/442536
DATED : April 21, 2020
INVENTOR(S) : David Mehrl and Greg Stoltz Page 1 of 1

It is certified that error appears in the above-identified patent and that said Letters Patent is hereby corrected as shown below:

In the Claims

Column 13
Claim 1, Line 65, after "component;" insert -- and --.

Column 14
Claim 1, Line 8, delete "component;" and insert -- component, --.
Claim 1, Lines 15-23, delete "wherein the first layer and the at least one second layer have different distances with respect to the main surface, wherein the second elongated light blocking slats and the first elongated light blocking slats are offset with respect to each other and along a direction parallel to the main surface, and wherein the first and second regions of incidence are a function of the offset." and insert -- wherein the first and second elongated light blocking slats are arranged in the multilayer mask to confine openings to determine whether light is blocked or passed along a given optical path. --.
Claim 3, Line 44, after "and" delete "the".

Column 16
Claim 18, Line 52, after "surface" insert -- , --.

Signed and Sealed this
Thirtieth Day of June, 2020

Andrei Iancu
*Director of the United States Patent and Trademark Office*